United States Patent
Kim et al.

(10) Patent No.: US 11,314,366 B2
(45) Date of Patent: Apr. 26, 2022

(54) INPUT SENSING DEVICE AND DISPLAY DEVICE INCLUDING THE SAME

(71) Applicant: SAMSUNG DISPLAY CO., LTD., Yongin-si (KR)

(72) Inventors: Jang Hui Kim, Suwon-si (KR); Hyung Chul Kim, Hwaseong-si (KR); A Ra Jo, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/073,761

(22) Filed: Oct. 19, 2020

(65) Prior Publication Data

US 2021/0034201 A1 Feb. 4, 2021

Related U.S. Application Data

(63) Continuation of application No. 16/358,254, filed on Mar. 19, 2019, now Pat. No. 10,831,329.

(30) Foreign Application Priority Data

May 2, 2018 (KR) .......................... 10-2018-0050430

(51) Int. Cl.
*G06F 3/044* (2006.01)
*G01L 1/22* (2006.01)
*G06F 3/041* (2006.01)

(52) U.S. Cl.
CPC .............. *G06F 3/0446* (2019.05); *G01L 1/22* (2013.01); *G06F 3/0412* (2013.01); *G06F 3/0443* (2019.05); *G06F 2203/04112* (2013.01)

(58) Field of Classification Search
CPC .... G06F 3/0446; G06F 3/0443; G06F 3/0421; G06F 3/0448; G06F 2203/04112; G06F 2203/04111; G06F 2203/04105; G01L 1/22; G01L 1/146; H01L 27/3225; H01L 27/323

See application file for complete search history.

(56) References Cited

U.S. PATENT DOCUMENTS

| | | | | |
|---|---|---|---|---|
| 8,305,358 | B2 * | 11/2012 | Klinghult | G06F 3/0414 345/174 |
| 9,105,255 | B2 * | 8/2015 | Brown | G06F 3/0446 |
| 9,116,569 | B2 * | 8/2015 | Stacy | G06F 3/0446 |
| 9,430,107 | B2 * | 8/2016 | Hanauer | G06F 3/04166 |
| 9,778,808 | B2 * | 10/2017 | Bae | G06F 3/0446 |
| 9,983,730 | B2 * | 5/2018 | Hashimoto | G06F 3/0412 |
| 10,133,418 | B2 * | 11/2018 | Smith | G06F 3/04144 |
| 10,372,259 | B2 * | 8/2019 | Hoch | G06F 3/04144 |

(Continued)

*Primary Examiner* — Ricardo Osorio

(74) *Attorney, Agent, or Firm* — F. Chau & Associates, LLC

(57) ABSTRACT

An input sensing device includes a plurality of first sensing electrodes having a plurality of first sensor units extending in a first direction. A plurality of second sensing electrodes has a plurality of second sensor units extending in a second direction different from the first direction. A first strain gauge includes a first force electrode located proximate to a first electrode of the plurality of first sensing electrodes. A second force electrode is located proximate to a second electrode of the plurality of first sensing electrodes. A first connecting electrode connects to both of the first force electrode and the second force electrode.

20 Claims, 11 Drawing Sheets

(56) References Cited

U.S. PATENT DOCUMENTS

| | | | |
|---|---|---|---|
| 10,379,574 B2 * | 8/2019 | Kim | H01L 27/323 |
| 10,386,970 B2 * | 8/2019 | Harley | G06F 3/0447 |
| 10,691,245 B2 * | 6/2020 | Kim | G02F 1/13338 |
| 10,831,329 B2 * | 11/2020 | Kim | G01L 1/146 |
| 2011/0278078 A1 * | 11/2011 | Schediwy | G06F 3/0446 |
| | | | 178/18.06 |
| 2012/0075243 A1 * | 3/2012 | Doi | G06F 3/04166 |
| | | | 345/174 |
| 2012/0138884 A1 | 6/2012 | Sleeman et al. | |
| 2012/0139864 A1 * | 6/2012 | Sleeman | G01L 5/228 |
| | | | 345/174 |
| 2013/0009805 A1 | 1/2013 | Castillo et al. | |
| 2013/0009905 A1 * | 1/2013 | Castillo | G06F 3/0414 |
| | | | 345/174 |
| 2013/0082970 A1 * | 4/2013 | Frey | G06F 3/04144 |
| | | | 345/173 |
| 2013/0154998 A1 * | 6/2013 | Yang | G06F 3/0418 |
| | | | 345/174 |
| 2013/0164998 A1 | 6/2013 | Yang et al. | |
| 2013/0215056 A1 * | 8/2013 | Johansson | G01R 27/14 |
| | | | 345/173 |
| 2014/0008203 A1 * | 1/2014 | Nathan | H03K 17/9625 |
| | | | 200/600 |
| 2014/0062034 A1 | 3/2014 | Coulson et al. | |
| 2014/0062933 A1 * | 3/2014 | Coulson | G06F 3/0445 |
| | | | 345/174 |
| 2014/0062934 A1 * | 3/2014 | Coulson | G06F 3/0447 |
| | | | 345/174 |
| 2014/0070875 A1 * | 3/2014 | Dunphy | G06F 3/0447 |
| | | | 327/517 |
| 2015/0122531 A1 * | 5/2015 | Monson | G01L 1/20 |
| | | | 174/253 |
| 2017/0277296 A1 * | 9/2017 | Reynolds | G06F 3/044 |
| 2017/0285709 A1 | 10/2017 | Iuchi et al. | |
| 2017/0285864 A1 | 10/2017 | Pedder et al. | |
| 2017/0315653 A1 * | 11/2017 | Vandermeijden | G06F 3/0447 |
| 2017/0315658 A1 * | 11/2017 | Vandermeijden | G06F 3/0446 |
| 2018/0058839 A1 | 3/2018 | Kim et al. | |
| 2018/0069053 A1 * | 3/2018 | Bok | H01L 51/5231 |
| 2018/0088716 A1 * | 3/2018 | Kim | G06F 3/045 |
| 2018/0095582 A1 | 4/2018 | Hwang et al. | |
| 2018/0308903 A1 * | 10/2018 | Jeong | H01L 27/3276 |
| 2019/0338817 A1 | 11/2019 | Kim et al. | |
| 2019/0369793 A1 * | 12/2019 | Hinson | G06F 3/0447 |

* cited by examiner

INPUT SENSING DEVICE AND DISPLAY DEVICE INCLUDING THE SAME

This application is a Continuation of co-pending patent application Publication Ser. No. 16/358,254 filed on Mar. 19, 2019, which claims priority to Korean Patent Application No. 10-2018-0050430, filed on May 2, 2018, in the Korean Intellectual Property Office, the disclosures of which are herein incorporated by reference in their entirety.

TECHNICAL FIELD

The present disclosure relates to a display device and, more specifically, to an input sensing device and a display device including the same.

DISCUSSION OF THE RELATED ART

Various types of display devices are in wide use today. Examples of popular display devices include a liquid crystal display (LCD), an organic light-emitting diode (OLED) display, and others.

Among the various types of display devices, the LCD is one of the most widely used flat panel display devices. The LCD includes two substrates on which electric field generating electrodes, such as pixel electrodes, common electrodes, and the like, are formed and a liquid crystal layer interposed between the two substrates. The LCD displays an image by applying a voltage to the electric field generating electrodes to generate an electric field within the liquid crystal layer, thereby determining an orientation of liquid crystal molecules in the liquid crystal layer and controlling polarization of incident light.

The OLED display uses OLEDs to display an image. The OLEDs generate light by recombining electrons with holes within an emission layer. The OLED display has a high response speed, a high luminance, and a wide viewing angle, and consumes less power than similarly sized LCDs.

SUMMARY

An input sensing device includes a plurality of first sensing electrodes having a plurality of first sensor units extending in a first direction. A plurality of second sensing electrodes has a plurality of second sensor units extending in a second direction different from the first direction. A first strain gauge includes a first force electrode located proximate to a first electrode of the plurality of first sensing electrodes. A second force electrode is located proximate to a second electrode of the plurality of first sensing electrodes. A first connecting electrode connects to both of the first force electrode and the second force electrode.

A display device includes a display panel and an input sensing panel disposed on the display panel. The input sensing panel includes a plurality of first sensing electrodes including a plurality of first sensor units disposed in a first direction, a plurality of second sensing electrodes including a plurality of second sensor units extending in a second direction different from the first direction, and a first strain gauge disposed on a same layer as the plurality of first sensor units and the plurality of second sensor units. The first strain gauge includes a first force electrode located proximate to one of the plurality of first sensing electrodes.

A display device includes a display panel, an input sensing panel disposed over the display panel, and a window disposed over the input sensing panel. The input sensing panel is configured to measure both a pressure of a touch and a position of the touch. The input sensing panel includes a plurality of first sensor units configured to measure the pressure of the touch, and a plurality of second sensor units configured to measure the position of the touch. The plurality of first sensor units and the plurality of second sensor units are disposed on a common layer.

BRIEF DESCRIPTION OF THE DRAWINGS

The above and other aspects and features of the present disclosure will become more apparent by describing exemplary embodiments thereof in detail with reference to the attached drawings, in which.

DETAILED DESCRIPTION OF THE EMBODIMENTS

Figure 1:
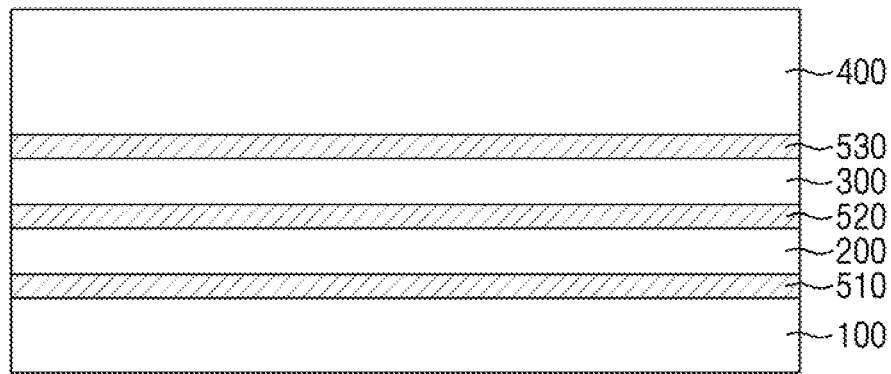
FIG. 1 is a cross-sectional view illustrating a display device according to an exemplary embodiment of the present disclosure.

Features of the inventive concept and methods of accomplishing the same may be understood more readily by reference to the following detailed description of exemplary embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art. Like reference numerals may refer to like elements throughout the specification and figures.

It will be understood that when an element or layer is referred to as being "on", "connected to" or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Throughout the specification and figures, the same reference numerals may be used to represent the same or similar components.

Hereinafter, exemplary embodiments of the present disclosure will be described with reference to the accompanying drawings.

FIG. 1 is a cross-sectional view illustrating a display device according to an exemplary embodiment of the present disclosure.

The display device, according to an exemplary embodiment of the present disclosure, may include a display panel 100, an input sensing panel 200, an anti-reflection panel 300, and a window panel 400. A component which is coupled to another component with an adhesive may be referred to herein as a "panel." In addition, a component, which is formed through a subsequent process after another component is formed, may be referred to herein as a "layer," As used herein, panels may include a base substrate, while layers may be disposed on a base substrate. Base substrates may include synthetic resin films, composite material films, glass, or the like.

The display panel 100 is a panel configured to display an image, in an exemplary embodiment of the present disclosure, the display panel 100 may be an organic light-emitting display panel, a liquid crystal display panel, a quantum dot display panel, or the like. Hereinafter, the display panel 100 will be described in terms of an organic fight-emitting display panel, although it is to be understood that other types of display panels may be used.

The input sensing panel 200 may be disposed on the display panel 100. In an exemplary embodiment of the present disclosure, the display panel 100 and the input sensing panel 200 may be coupled to each other by a first adhesive member 510. The input sensing panel 200 may be configured to sense both a position and pressure of a touch. The touch may be that of a user's hand or a stylus. For example, the input sensing panel 200 may sense both the touch position and the touch pressure. The input sensing panel 200 may be referred to as an input sensing device and the input sensing device may be embodied as an independent object that is a separate component from the display panel 100, the window panel 400, or the like.

The anti-reflection panel 300 may be disposed on the input sensing panel 200. In an exemplary embodiment of the present disclosure, the anti-reflection panel 300 and the input sensing panel 200 may be coupled to each other by a second adhesive member 520. The anti-reflection panel 300 may reduce the reflectivity of external light incident from an upper side of the window panel 400. In an exemplary embodiment of the present disclosure, the anti-reflection panel 300 may include both a retarder and a polarizer. Further, the anti-reflection panel 300 may include both a black matrix and a color filter. The anti-reflection panel 300 may also be omitted.

The window panel 400 may be disposed on the anti-reflection panel 300. In an exemplary embodiment of the present disclosure, the window panel 400 and the anti-reflection panel 300 may be coupled to each other by a third adhesive member 530. The window panel 400 may protect the display panel 100 or the input sensing panel 200 from scratching or the like.

In an exemplary embodiment of the present disclosure, the first to third adhesive members 510, 520, and 530 may each be a pressure-sensitive adhesive (PSA) member, an optically clear adhesive (OCA) member, or an optically clear resin (OCR) film. Further, at least one of the input sensing panel 200, the anti-reflection panel 300, and the window panel 400 may be formed as a layer which is laminated on another component, and does not include its own base substrate. For example, the input sensing panel 200 may be formed as an input sensing layer which uses an upper surface of the display panel 100 as a base surface thereof. For example, the input sensing layer may be formed by a subsequent process after a process of forming the display panel 100.

Hereinafter, the input sensing panel 200 will be described in more detail.

Figure 2:
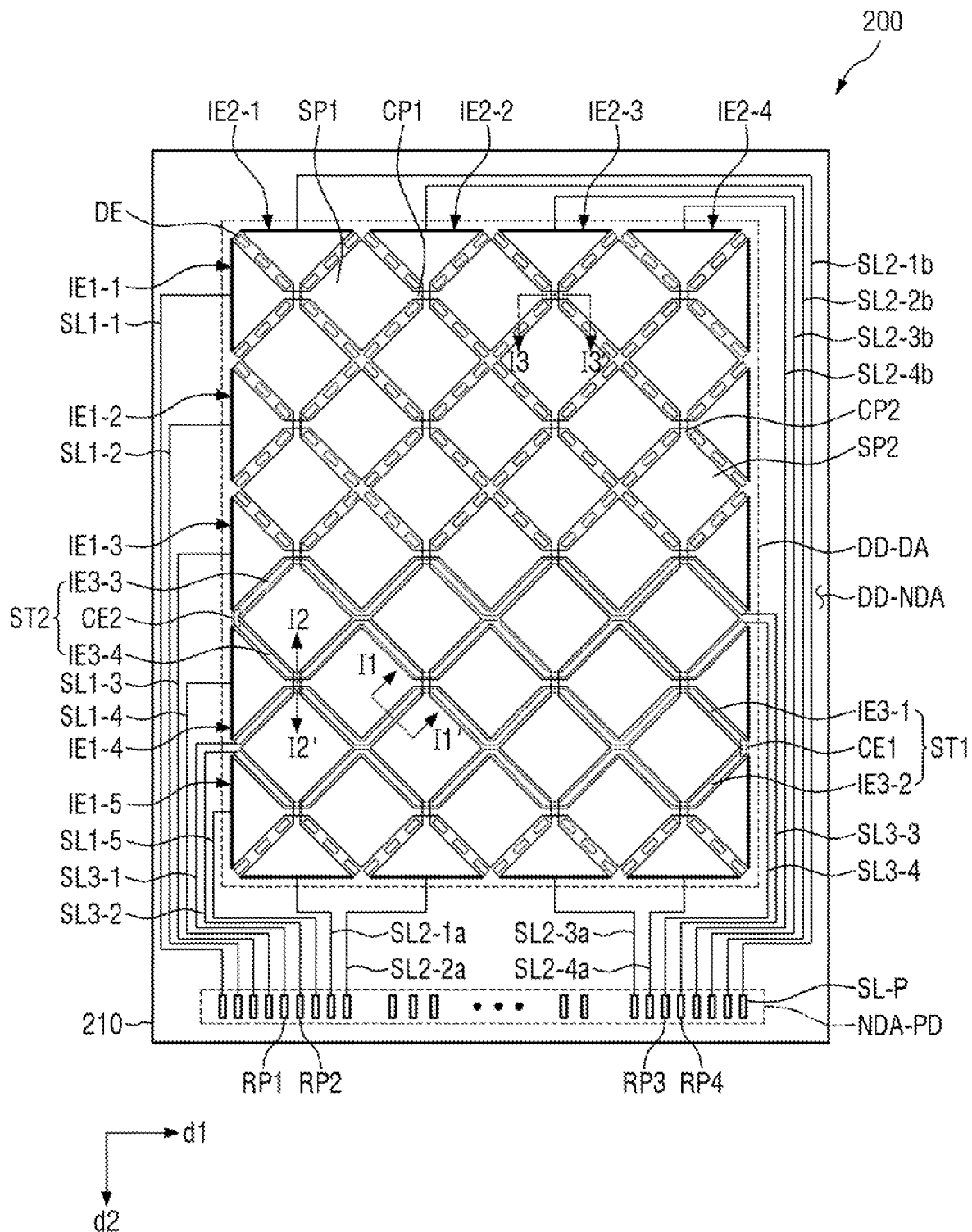
FIG. 2 is a schematic plan view illustrating an input sensing panel shown in FIG. 1.

FIG. 2 is a schematic plan view showing the input sensing panel shown in FIG. 1.

Referring to FIG. 2, the input sensing panel 200 may include a base layer 210, a plurality of first sensing electrodes IE1-1 to IE1-5, a plurality of second sensing electrodes IE2-1 to IE2-4, first strain gauges ST1, second strain gauges ST2, a plurality of dummy electrodes DE, a plurality of first signal lines SL1-1 to SL1-5, a plurality of primary second signal lines SL2-1a to SL2-4a, a plurality of secondary second signal lines SL2-1b to SL2-4b, and a plurality of third signal lines SL3-1 to SL3-4.

The base layer 210 may be disposed on the display panel 100 and may be coupled to the upper surface of the display panel 100 by the first adhesive member 510 (see FIG. 1). In an exemplary embodiment of the present disclosure, the base layer 210 may be a synthetic resin film, a glass substrate, an organic/inorganic composite material substrate, or the like. The base layer 210 is not limited to having only a single layer, and may include a plurality of layers coupled to each other through an adhesive member or the like. In an exemplary embodiment of the present disclosure, when the input sensing panel 200 is an input sensing layer directly formed on the display panel 100, the base layer 210 may be omitted.

The base layer 210 may be divided into a display region DD-DA and a non-display region DD-NDA. Here, the display region DD-DA is defined as a region overlapping a region on which an image is displayed on the display panel 100 (see FIG. 1). Further, the non-display region DD-NDA is defined as a region which is located outside the display region DD-DA and overlaps a region on which an image is not displayed on the display panel 100 (e.g. a region that does not include pixels).

The plurality of first sensing electrodes IE1-1 to IE1-5, the plurality of second sensing electrodes IE2-1 to IE2-4, the first strain gauges ST1, the second strain gauges ST2, and the plurality of dummy electrodes DE may be disposed in the display region DD-DA. Further, the plurality of first signal lines SL1-1 to SL1-5, the plurality of primary second signal lines SL2-1a to SL2-4a, the plurality of secondary second signal lines SL2-1b to SL2-4b, and the plurality of third signal lines SL3-1 to SL3-4 may be disposed in the non-display region DD-NDA.

Each of the plurality of first sensing electrodes IE1-1 to IE1-5 may include a plurality of first sensor units SP1 and a plurality of first connecting units CP1. The plurality of first sensor units SP1 may be disposed in a first direction d1 and connected to each other using the plurality of first connecting units CP1. For example, the plurality of first connecting units CP1 may be disposed between pairs of the plurality of first sensor units SN and the first connecting units CP1 may electrically and physically connect the plurality of adjacent first sensor units SP1 to each other.

Each of the plurality of first sensing electrodes IE1-1 to IE1-5 may be disposed in the display region DD-DA in a second direction d2. According to an exemplary embodiment of the present disclosure, the first direction d1 may cross the second direction d2. Referring to FIG. 2, the first direction d1 is a row direction and the second direction d2 is a column direction. For example, the plurality of first sensing electrodes IE1-1 to IE1-5 may be spaced apart from each other and disposed on different rows.

The plurality of first sensing electrodes IE1-1 to IE1-5 may be connected to the plurality of first signal lines SL1-1 to SL1-5, respectively. For example, first ends of the plurality of first sensing electrodes IE1-1 to IE1-5 may be directly connected to first ends of the plurality of first signal lines SL1-1 to SL1-5, respectively. Second ends of the plurality of first signal lines SL1-1 to SL1-5 may be directly connected to a plurality of first signal pad units SL-P included in a pad region NDA-PD, respectively.

Each of the plurality of second sensing electrodes IE2-1 to IE2-4 may include a plurality of second sensor units SP2 and a plurality of second connecting units CP2. The plurality of second sensor units SP2 may be disposed in the second direction d2 and connected to each other using the plurality of second connecting units CP2. For example, the plurality of second connecting units CP2 may be disposed between the plurality of second sensor units SP2 and may electrically and physically connects the plurality of adjacent second sensor units SP2 to each other.

Each of the plurality of second sensing electrodes IE2-1 to IE2-4 may be disposed in the display region DD-DA in the first direction d1. For example, the plurality of second sensing electrodes IE2-1 to IE2-4 may be spaced apart from each other and disposed in different columns. The plurality of second sensor units SP2 of the plurality of second sensing electrodes IE2-1 to IE2-4 may be disposed on the same layer as the plurality of first sensing electrodes IE1-1 to IE1-5. Alternatively, the plurality of second connecting units CP2 may be disposed on the plurality of first sensing electrodes IE1-1 to IE1-5 and the plurality of second sensor units SP2.

The plurality of second sensing electrodes IE2-1 to IE2-4 may be connected to the plurality of second signal lines SL2-1 to SL2-4, respectively. For example, first ends of the plurality of second sensing electrodes IE2-1 to IE2-4 may be directly connected to first ends of the plurality of primary second signal lines SL2-1a to SL2-4a, respectively. Further, second ends of the plurality of second sensing electrodes IE2-1 to IE2-4 may be directly connected to first ends of the plurality of secondary second signal lines SL2-1b to SL2-4b, respectively. Second ends of the plurality of primary second signal lines SL2-1a to SL2-4a and second ends of the plurality of secondary second signal lines SL2-1b to SL2-4b may be directly connected to the plurality of first signal pad units SL-P included in the pad region NDA-PD.

For example, both ends of the plurality of second sensing electrodes IE2-1 to IE2-4 may be connected to the plurality of first signal pad units SL-P through a plurality of signal lines. Accordingly, sensing sensitivity may be preserved by preventing a voltage drop of a driving signal that may be generated in the plurality of second sensing electrodes IE2-1 to IE2-4 having a relatively longer length than the plurality of first sensing electrodes IE1-1 to IE1-5.

In an exemplary embodiment of the present disclosure, only the first ends of the plurality of second sensing electrodes IE2-1 to IE2-4 are connected to the plurality of first signal pad units SL-P. Further, both ends of the plurality of first sensing electrodes IE1-1 to IE1-5 may also be connected to the plurality of first signal pad units SL-P.

In an exemplary embodiment of the present disclosure, each of the plurality of first sensor units SP1 and the plurality of second sensor units SP2 may have a square, diamond, or rhombus shape. The square, diamond, or rhombus shape may alternatively be another polygonal shape that is close to the square, diamond, or rhombus shape in consideration of process conditions or the like. However, the present disclosure is not limited thereto, and the plurality of first sensor units SP1 and the plurality of second sensor units SP2 may have an arbitrary polygonal shape, or may have another shape (e.g., a bar shape). Further, the shapes and the arrangement structures of the first strain gauges ST1, the second strain gauges ST2, and the plurality of dummy electrodes DE may differ according to the shapes of the plurality of sensor units. Furthermore, the arrangement structures of the plurality of first signal lines SL1-1 to SL1-5, the plurality of primary second signal lines SL2-1a to SL2-4a, and the plurality of secondary second signal lines SL2-1b to SL2-4b are not limited to those shown in FIG. 2.

In an exemplary embodiment of the present disclosure, all of the plurality of first signal lines SL1-1 to SL1-5, the plurality of primary second signal lines SL2-1a to SL2-4a, and the plurality of secondary second signal lines SL2-1b to SL2-4b may be disposed on the same side in a plan view.

In an exemplary embodiment of the present disclosure, the plurality of first signal lines SL1-1 to SL1-5, the plurality of primary second signal lines SL2-1a to SL2-4a, and the plurality of secondary second signal lines SL2-1b to SL2-4b may be replaced by circuit boards or the like which are manufactured and coupled separately.

The plurality of first sensing electrodes IE1-1 to IE1-5 and the plurality of second sensing electrodes IE2-1 to IE2-4 may be alternately disposed. Each of the plurality of first sensing electrodes IE1-1 to IE1-5 and each of the plurality of second sensing electrodes IE2-1 to IE2-4 may act as a driving electrode (Tx) or a sensing electrode (Rx) and sense external touch input.

In an exemplary embodiment of the present disclosure, the plurality of first sensing electrodes IE1-1 to IE1-5 and the plurality of second sensing electrodes IE2-1 to IE2-4 may sense external touch input by a mutual-cap method and/or a self-cap method.

In an exemplary embodiment of the present disclosure, the plurality of first sensing electrodes IE1-1 to IE1-5 and the plurality of second sensing electrodes IE2-1 to IE2-4 may calculate coordinates of external touch input during a first interval by a mutual-cap method and then re-calculate coordinates of the external touch input during a second interval by a self-cap method.

The plurality of dummy electrodes DE may be disposed on the same layer as a layer on which the plurality of first sensing electrodes IE1-1 to IE1-5 and the plurality of second sensing electrodes IE2-1 to IE2-4 are disposed, in the display region DD-DA. For example, the plurality of dummy electrodes DE may be disposed at a boundary between the plurality of first sensing electrodes IE1-1 to IE1-5 and the plurality of second sensing electrodes IE2-1 to IE2-4. Therefore, the plurality of dummy electrodes DE may prevent the degradation of the optical visibility characteristic that may otherwise be caused by a visible patterns of the plurality of sensing electrodes or the like.

Each of the plurality of dummy electrodes DE may be a floating electrode having an insular shape. Further, the plurality of dummy electrodes DE may have different shapes. The plurality of dummy electrodes DE may be formed to have different shapes, and thus the visibility of these structures to the user may be reduced so that the optical visibility characteristic may be increased.

In an exemplary embodiment of the present disclosure, the first strain gauges ST1 may be disposed on the same layer as the plurality of first sensing electrodes IE1-1 to IE1-5, the plurality of second sensing electrodes IE2-1 to IE2-4, and the plurality of dummy electrodes DE are disposed. The first strain gauges ST1, the plurality of first sensing electrodes IE1-1 to IE1-5, the plurality of second sensing electrodes IE2-1 to IE2-4, and the plurality of dummy electrodes DE are disposed in the display region DD-DA. Each of the first strain gauges ST1 has a shape in which the plurality of dummy electrodes DE are connected to each other. Hereinafter, the first strain gauges ST1 will be described in more detail.

The first strain gauge ST1 may have a shape substantially extending in the first direction d1. The first strain gauge ST1 may have a shape in which a first force electrode IE3-1, a second force electrode IE3-2, and a first connecting electrode CE1 are coupled to each other.

The first force electrode IE3-1 may substantially extend in the first direction d1 and may include at least one bent portion. Further, the first force electrode IE3-1 may extend along one side of the first sensing electrode IE1-4, for example, along an outer periphery of a lower portion of the first sensing electrode IE1-4, as shown in FIG. 2.

The second force electrode IE3-2 may substantially extend in the first direction d1 and may include at least one bent portion. Further, the second force electrode IE3-2 may extend along one side of the first sensing electrode IE1-5, for example, along an outer periphery of an upper portion of the first sensing electrode IE1-5, as shown in FIG. 2. In an exemplary embodiment of the present disclosure, the first force electrode IE3-1 and the second force electrode IE3-2 may be symmetrical with respect to each other. The first force electrode IE3-1 and the second force electrode IE3-2 may also be in a zigzag shape.

The first connecting electrode CE1 may be disposed at one side of the first force electrode IE3-1 and one side of the second force electrode IE3-2 to connect the first force electrode IE3-1 to the second force electrode IE3-2. Accordingly, the first strain gauges ST1 may have a loop shape extending along an outer periphery of each of the plurality of second sensor units SP2 disposed on the same row.

The second strain gauges ST2 may be disposed above the first strain gauges ST1 as shown in FIG. 2. However, the arrangement positions of the first and second strain gauges ST1 and ST2 are not limited to those shown in FIG. 2. The second strain gauge ST2 may have a shape extending substantially in the first direction d1. The second strain gauge ST2 may have a shape in which a third force electrode IE3-3, a fourth force electrode IE3-4, and a second connecting electrode CE2 are coupled to each other.

Each of the third force electrode IE3-3 and the fourth force electrode IE3-4 may extend substantially in the first direction d1 and may include at least one bent portion. The third force electrode IE3-3 may extend along one side off to first sensing electrode IE1-3, for example, along an outer periphery of a lower portion of the first sensing electrode IE1-3, as shown in FIG. 2. The fourth force electrode IE3-4 may extend along one side of the first sensing electrode IE1-4, for example, along an outer periphery of an upper portion of the first sensing electrode IE1-4, as shown in FIG. 2. In an exemplary embodiment of the present disclosure, the third force electrode IE3-3 and the fourth force electrode IE3-4 may be symmetrical with respect to each other. The third force electrode IE3-3 and the fourth force electrode IE3-4 may also be expressed in a zigzag shape.

The second connecting electrode CE2 may be disposed at another side of the third force electrode IE3-3 and another side of the fourth force electrode IE3-4 to connect the third force electrode IE3-3 to the fourth force electrode IE3-4. The second strain gauges ST2 may have a loop shape extending along the outer periphery of each of the plurality of second sensor units SP2 disposed on the same row.

In FIG. 2, the second connecting electrode CE2 is shown as being disposed at a side different from the first connecting electrode CE1, but the present disclosure is not limited thereto. The first connecting electrode CE1 and the second connecting electrode CE2 may be disposed at the same side.

The first and second strain gauges ST1 and ST2 may be connected to second signal pad units RP1 to RP4, which will be described below, through the plurality of third signal lines SL3-1 to SL3-4. In the display device according to the embodiment of the present disclosure, an amount of change in resistance of the first and second strain gauges ST1 and ST2 may be measured through the second signal pad units RP1 to RP4 and the plurality of third signal lines SL3-1 to SL3-4, and thus the touch pressure of the user may be sensed. This will be described below.

Unlike the one shown in the drawing, the first and second strain gauges ST1 and ST2 may have different shapes. Further, the shapes of the first and second strain gauges ST1 and ST2 may be changed according to the shapes of the plurality of first sensing electrodes IE1-1 to IE1-5 and the plurality of second sensing electrodes IE2-1 to IE2-4.

In an exemplary embodiment of the present disclosure, the plurality of first sensing electrodes IE1-1 to IE1-5, the plurality of second sensing electrodes IE2-1 to IE2-4, the first strain gauges ST1, the second strain gauges ST2, and the plurality of dummy electrodes DE may be formed of a transparent or semitransparent conductive material. Here, the transparent or semitransparent conductive material may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

In an exemplary embodiment of the present disclosure, each of the plurality of first signal lines SL1-1 to SL1-5, the plurality of primary second signal lines SL2-1a to SL2-4a, the plurality of secondary second signal lines SL2-1b to SL2-4b, and the plurality of third signal lines SL3-1 to SL3-4 may be formed as a single film including conductive materials such as aluminum (Al), copper (Cu), molybdenum (Mo), chromium (Cr), titanium (Ti), tungsten (W), molybdenum tungsten (MoW), molybdenum titanium (MoTi) and copper/molybdenum titanium (Cu/MoTi), funned as a double film including the aforementioned conductive materials, or formed as a triple film including the aforementioned conductive materials. However, the present disclosure is not limited thereto, and the plurality of first signal lines SL1-1 to SL1-5, the plurality of primary second signal lines SL2-1a to SL2-4a, the plurality of secondary second signal lines SL2-1b to SL2-4b, and the plurality of third signal lines SL3-1 to SL3-4 may be made of various metals or other conductors.

In an exemplary embodiment of the present disclosure, the plurality of first sensing electrodes IE1-1 to IE1-5, the plurality of second sensing electrodes IE2-1 to IE2-4, the first strain gauges ST1, the second strain gauges ST2 may be disposed on a different layer from that of the plurality of first signal lines SL1-1 to SL1-5, the plurality of primary second signal lines SL2-1a to SL2-4a, the plurality of secondary second signal lines SL2-1b to SL2-4b, and the plurality of third signal lines SL3-1 to SL3-4. Accordingly, a contact hole and a connecting electrode for electrically connecting two conductors disposed on different layers may be additionally needed.

The pad region NDA-PD is defined as a region in which a plurality of pad units are disposed. The pad region NDA-PD may include the first signal pad units SL-P and the second signal pad units RP1 to RP4. The pad region NDA-PD may be electrically connected to a touch driving circuit through a separate flexible substrate.

The first signal pad units SL-P may be connected to the plurality of first signal lines SL1-1 to SL1-5, the plurality of primary second signal lines SL2-1a to SL2-4a, and the plurality of secondary second signal lines SL2-1b to SL2-4b. Accordingly, the plurality of first sensing electrodes IE1-1 to IE1-5 may receive a driving signal from the touch driving circuit through the first signal pad units SL-P which are connected to the plurality of first signal lines SL1-1 to SL1-5 and the plurality of first signal lines SL1-1 to SL1-5. Further, the plurality of second sensing electrodes IE2-1 to IE2-4 may receive a driving signal from the touch driving circuit through the first signal pad units SL-P which are connected to the plurality of primary second signal lines SL1-1a to SL2-4a, the plurality of secondary second signal lines SL2-1b to SL2-4b, and the plurality of signal lines.

The second signal pad units RP1 to RP4 may be connected to the first and second strain gauges ST1 and ST2 through the plurality of third signal lines SL3-1 to SL3-4. The second signal pad units RP1 to RP4 may be connected to the first strain gauges ST1, the second strain gauges ST2, and a Wheatstone bridge circuit unit, which will be described below. The Wheatstone bridge circuit unit may be configured to measure the touch pressure by a change in resistance of the first and second strain gauges ST1 and ST2. This will be described below.

Hereinafter, an arrangement relationship between the components included in the input sensing panel 200 will be described.

Figure 3:
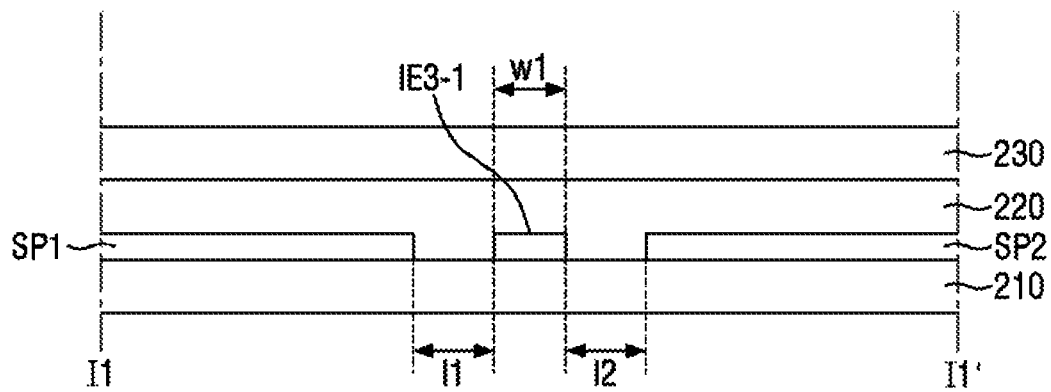
FIG. 3 is a cross-sectional view taken along line I1-I1' shown in FIG. 2.
Figure 4:
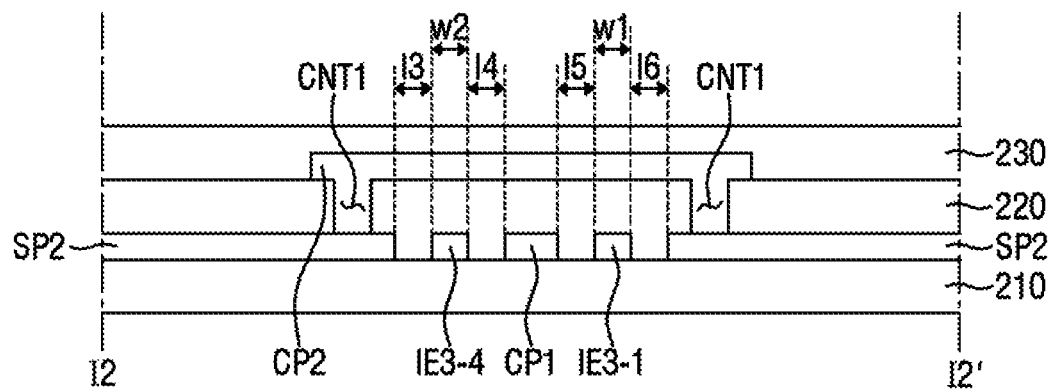
FIG. 4 is a cross-sectional view taken along line I2-I2' shown in FIG. 2.
Figure 5:
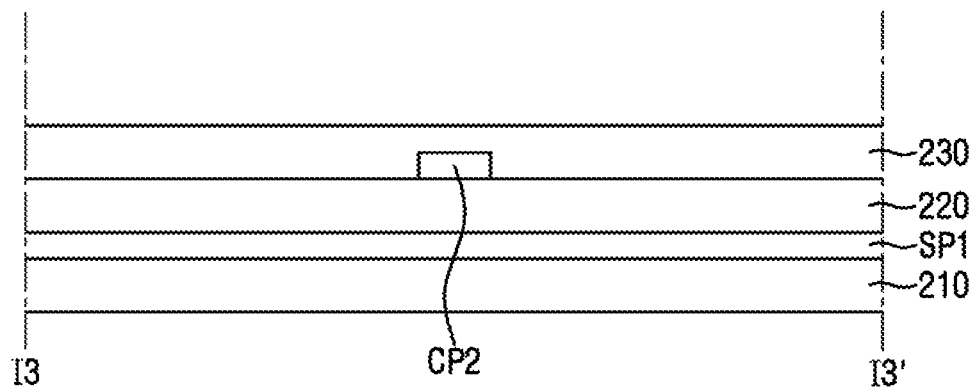
FIG. 5 is a cross-sectional view taken along line I3-I3' shown in FIG. 2.

FIG. 3 is a cross-sectional view taken along line I1-I1' shown in FIG. 2. FIG. 4 is a cross-sectional view taken along line I2-I2' shown in FIG. 2. FIG. 5 is a cross-sectional view taken along line I3-I3' shown in FIG. 2.

Referring to FIGS. 2 to 5, the plurality of first sensing electrodes IE1-1 to IE1-5, the plurality of second sensor units SP2 of the plurality of second sensing electrodes IE2-1 to IE2-4, the first strain gauges ST1, and the second strain gauges ST2 may be disposed on the base layer 210 and may be disposed on the same layer. In an exemplary embodiment of the present disclosure, the plurality of first sensing electrodes IE1-1 to IE1-5, the plurality of second sensor units SP2 of the plurality of second sensing, electrodes IE2-1 to IE2-4, the first strain gauges ST1, and the second strain gauges ST2 may be simultaneously formed during a single process involving a single mask.

A first insulating layer 220 may be disposed on the plurality of first sensing electrodes IE1-1 to IE1-5, the plurality of second sensor units SP2 of the plurality of second sensing electrodes IE2-1 to IE2-4, the first strain gauges ST1, and the second strain gauges ST2. First contact holes CNT1 may be thrilled in the first insulating layer 220 to expose at least a portion of each of the plurality of second sensor units SP2. In an exemplary embodiment of the present disclosure, the first insulating layer 220 may have a single layer structure or a multi-layer structure. In an exemplary embodiment of the present disclosure, the first insulating layer 220 may include an inorganic material, an organic material, or a composite material. Here, the inorganic material may include aluminum oxide, titanium oxide, silicon oxide, silicon oxynitride, zirconium oxide, and/or hafnium oxide. Further, the organic material may include, an acrylic resin, a methacrylic resin, a polyisoprene, a vinyl resin, an epoxy resin, a urethane resin, a cellulose resin, a siloxane resin, a polyimide resin, a polyamide resin, and/or a perylene resin. In an exemplary embodiment of the present disclosure, the first insulating layer 220 may be formed of an elastic material having a high dielectric constant.

The plurality of second connecting units CP2 may be disposed on the first insulating layer 220. The plurality of second connecting units CP2 may be in direct contact with the plurality of second sensor units SP2, which are exposed by the first contact holes CNT1, the first insulating layer 220. Accordingly, the plurality of second connecting units CP2 may electrically connect the plurality of adjacent second sensor units SP2 to each other.

A second insulating layer 230 may be disposed on the plurality of second connecting units CP2. The second insulating layer 230 may serve as a protective layer for protecting the plurality of second connecting units CP2 or the like. In an exemplary embodiment of the present disclosure, the second insulating layer 230 may include an inorganic material, an organic material, or a composite material. In an exemplary embodiment of the present disclosure, the second insulating layer 230 may be formed of an adhesive material. In this case, the second adhesive member 520 shown in FIG. 1 may be omitted, and the anti-reflection panel 300 and the input sensing panel 200 may be coupled to each other through the second insulating layer 230.

In an exemplary embodiment of the present disclosure, the first force electrodes IE3-1 of the first strain gauges ST1 may have the same first width w1. Here, the first width w1 may be within a range of about 30 am to about 140 μm. Further, in an exemplary embodiment of the present disclosure, a distance l1 between the first force electrode IE3-1 and the first sensor units SP1 and a distance l2 between the first force electrode IE3-1 and the second sensor unit SP2 may be the same as or different from each other. In an exemplary embodiment of the present disclosure, the distances l1 and l2 may range from about 20 μm to about 30 μm.

In an exemplary embodiment of the present disclosure, the fourth force electrodes IE3-4 of the second strain gauges ST2 may have the same second width w2. Here, the second width w2 may satisfy a value of about 30 μm to about 140 μm. The first width w1 and the second width w2 may be the same or may be different from each other. Further, in an exemplary embodiment of the present disclosure, a distance l3 between the fourth force electrode IE3-4 and the second sensor unit SP2, a distance l4 between the fourth force electrode IE3-4 and the first connecting units CP1, a distance l5 between the first force electrode IE3-1 and the first connecting units CP1, and a distance l6 between the first force electrode IE3-1 and the second sensor unit SP2 may be the same or may be different from each other. In an exemplary embodiment of the present disclosure, the distances l3, l4, l5, and l6 may range from about 20 μm to about 30 μm.

The first insulating layer 220, which is fully funned, may be replaced by an insulating pattern 240 (see FIG. 6) which is disposed on only a portion of the base layer 210. This will be described in more detail with reference to FIG. 6.

Figure 6:
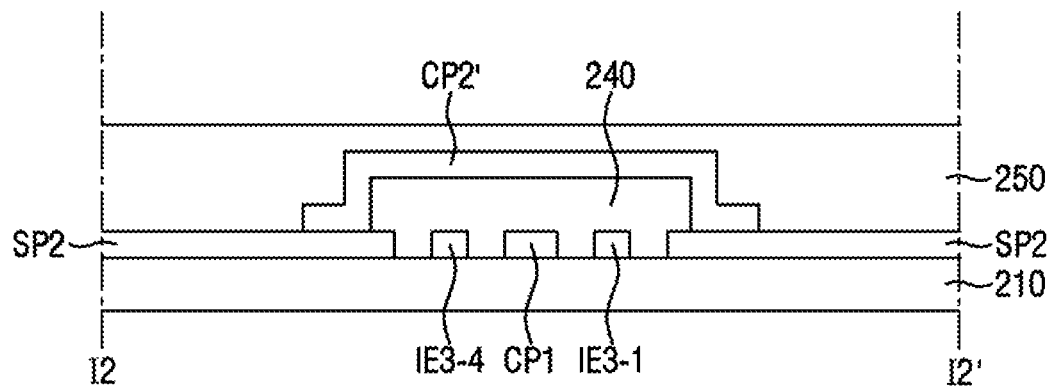
FIG. 6 is a cross-sectional view illustrating a display device according to an exemplary embodiment of the present disclosure.

FIG. 6 is a cross-sectional view showing a display device according to an exemplary embodiment of the present disclosure. Here, FIG. 6 corresponds to the cross-sectional view taken along line I2-I2' shown in FIG. 2.

Referring to FIG. 6, the insulating pattern 240 may be disposed on the plurality of first connecting units CP1 and may be located in regions in which the plurality of first connecting units CP1 and the plurality of second sensor units CP2' cross each other. In an exemplary embodiment of the present disclosure, the insulating pattern 240 may include a photosensitive material such as silicon dioxide, titanium dioxide, zinc oxide, silicon nitride, aluminum nitride, and/or tantalum oxide. In an exemplary embodiment of the present disclosure, the insulating pattern 240 may include an organic material or an inorganic material.

A plurality of second connecting units CP2' may be disposed on the insulating pattern 240 and may be directly connected to the plurality of adjacent second sensor units SP2. Therefore, the plurality of adjacent second sensor units SP2 may be electrically connected to each other.

A third insulating layer 250 may be disposed on the plurality of second connecting units CP2'. Since the third insulating layer 250 is formed of the same material as the second insulating layer 230 described above, a description thereof will be omitted.

Next, a method of sensing a touch pressure by a change in resistance of first and second strain gauges ST1 and ST2 will be described with reference to FIG. 7.

Figure 7:
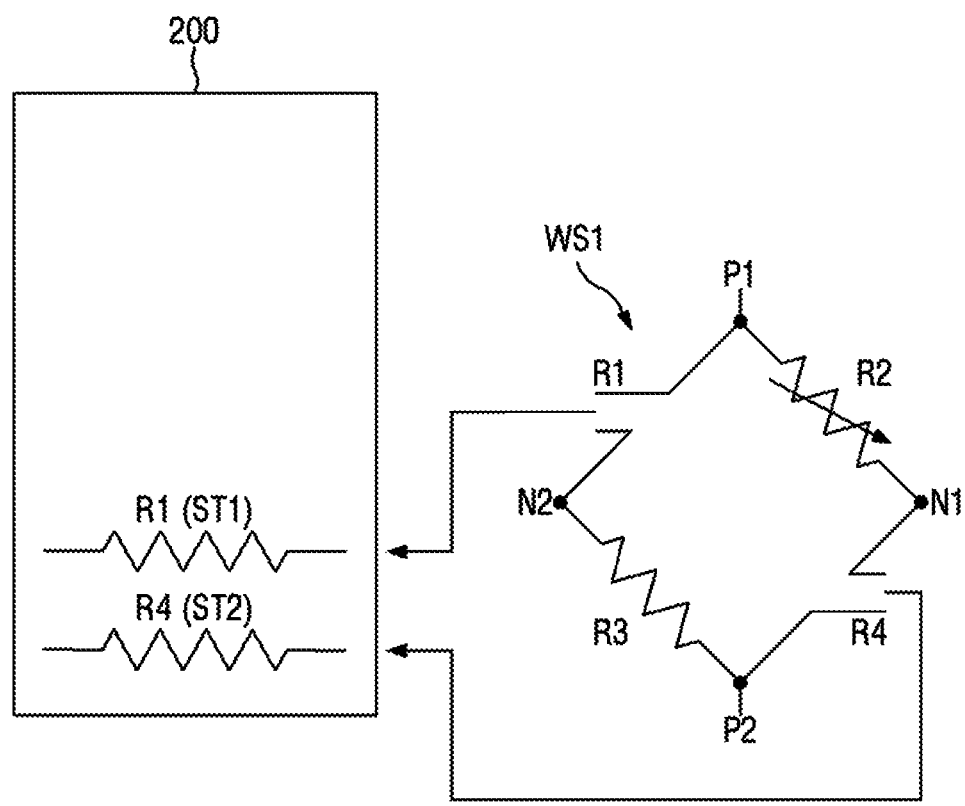
FIG. 7 is a schematic view illustrating a method of sensing a touch pressure in a display device according to an exemplary embodiment of the present disclosure.

FIG. 7 is a diagram illustrating a method of sensing a touch pressure in a display device according to an exemplary embodiment of the present disclosure.

Referring to FIG. 7, each of first and second strain gauges ST1 and ST2 corresponds to one resistor constituting a first Wheatstone bridge circuit unit WS1.

For example, the first strain gauge ST1 may constitute a first resistor R1 of the first Wheatstone bridge circuit unit WS1 and the second strain gauge ST2 may constitute a fourth resistor R4 of the first Wheatstone bridge circuit unit WS1. In an exemplary embodiment of the present disclosure, a second resistor R2 may be a variable resistor. Further, in an exemplary embodiment of the present disclosure, a third resistor R3 may have a fixed value.

A third strain gauge ST3 as a second resistor R2 and a fourth strain gauges ST4 as a third resistor R3 may be included in the first Wheatstone bridge circuit unit WS1. Each of a first power source P1 and a second power source P2 of the first Wheatstone bridge circuit unit WS1 may receive an external voltage. Here, in an exemplary embodiment of the present disclosure, the second power source P2 may receive a ground (GND) voltage.

A first end of the first resistor R1 may be connected to the first power source P1 and a second end thereof may be connected to a second terminal N2. A first end of the second resistor R2 may be connected to the first power source P1 and a second end thereof may be connected to a first terminal N1. A first end of the third resistor R3 may be connected to the second terminal N2 and a second end thereof may be connected to the second power source P2. Further, a first end of the fourth resistor R4 may be connected to the first terminal N1 and a second other end thereof may be connected to the second power source P2. Here, a potential difference between the first terminal N1 and the second terminal N2 may be made zero by adjusting a value of the second resistor R2 which is a variable resistor. Accordingly, no current flows between the first terminal N1 and the second terminal N2.

Thereafter, when the user applies a touch pressure to the input sensing panel 200, and for example, to at least a portion of a region in which the first and second strain gauges ST1 and ST2 are disposed, at least one of the resistors R1 and R4 corresponding to the first and second strain gauges ST1 and ST2 are changed. For example, the lengths of the first and second strain gauges ST1 and ST2 may be increased by the external touch pressure, and the corresponding resistance value may be changed accordingly.

Due to the change in resistance, a voltage difference is generated between the first terminal N1 and the second terminal N2 and a current corresponding to the voltage difference flows. The touch pressure of the user may be sensed by measuring the voltage difference or an amount of the flowing current, in an exemplary embodiment of the present disclosure, the touch driving circuit may measure the voltage difference or the amount of the current and sense the touch pressure of the user on the basis of the measured result.

A position of the first Wheatstone bridge circuit unit WS1 is not particularly limited. In an exemplary embodiment of the present disclosure, the first Wheatstone bridge circuit unit WS1 may be formed by appropriately arranging interconnections including the first and second strain gauges ST1 and ST2 in the non-display region DD-NDA. In an exemplary embodiment of the present disclosure, the first Wheatstone bridge circuit unit WS1 may be formed on a flexible substrate electrically connected to the pad region NDA-PD.

For example, the input sensing panel 200 may sense the touch pressure of the user by a change in resistance of the strain gauge. Further, the first and second strain gauges ST1 and ST2 may be disposed at a boundary between the plurality of first sensing electrodes IE1-1 to IE1-5 and the plurality of second sensing electrodes IE2-1 to IE2-4, and thus the degradation of the optical visibility characteristic due to the visible patterns of the plurality of sensing electrodes or the like may be prevented.

In the display device, according to an exemplary embodiment of the present disclosure, a touch position of the user may be sensed by a change in capacitance between the plurality of first sensing electrodes IE1-1 to IE1-5 and the plurality of second sensing electrodes IE2-1 to IE2-4, and the touch pressure of the user may be sensed by a change in resistance between the strain gauge located in the corresponding region. For example, the display device, according to an exemplary embodiment of the present disclosure, may include the input sensing panel 200 which senses both the touch position and pressure of the user, and may thus not include a separate sensor module for detecting a touch pressure. Therefore, a total thickness of the input sensing panel 200 may be reduced.

Unlike the arrangement shown in FIG. 7, the input sensing panel 200 may form a plurality of Wheatstone bridge circuit units. For example, the number of Wheatstone bridge circuit units, the number of strain gauges constituting the Wheatstone bridge circuit units, positions of the strain gauges, the number of fixed resistors, and the like may vary according to a region in which the touch pressure of the user is required to be detected.

This will be described in more detail with reference to FIGS. 8 to 16. However, descriptions identical to that of FIGS. 1 to 7 will be omitted.

Figure 8:
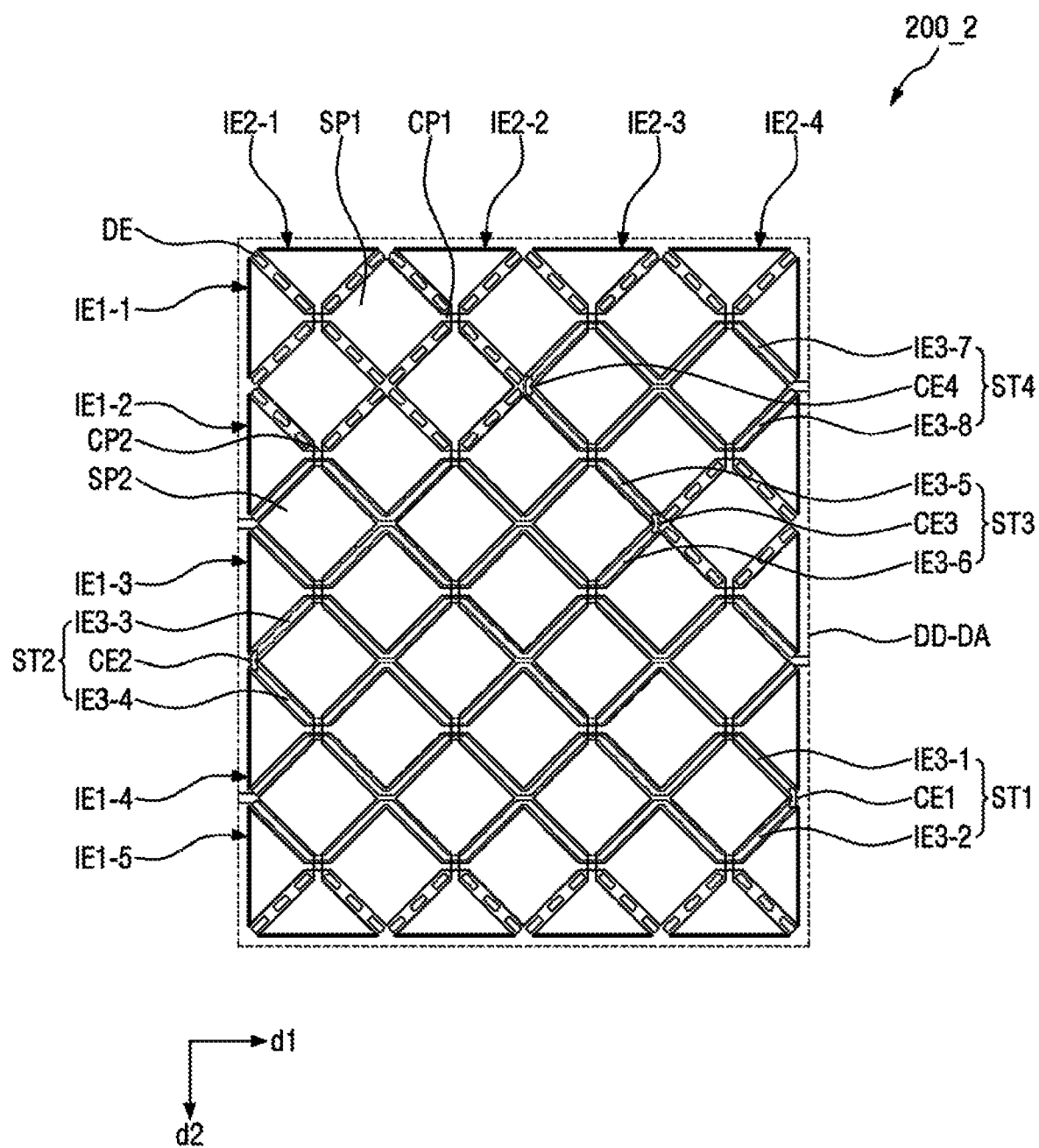
FIG. 8 is a plan view illustrating an input sensing panel of a display device according to an exemplary embodiment of the present disclosure.

FIG. 8 is a plan view showing an input sensing panel of a display device according to an exemplary embodiment of the present disclosure.

Referring to FIG. 8, an input sensing panel 200_2 may further include third strain gauges ST3 and fourth strain gauges ST4.

The third strain gauge ST3 may have a shape extending substantially in a first direction d1 and may be disposed on only some regions in a row. The third strain gauges ST3 may have a shape in which a fifth force electrode IE3-5, a sixth force electrode IE3-6, and a third connecting electrode CE3 are coupled to each other.

The fourth strain gauge ST4 may have a shape extending substantially in the first direction d1 and may be disposed on only some regions in the row. The fourth strain gauges ST4 may have a shape in which a seventh force electrode IE3-7, an eighth force electrode IE3-8, and a fourth connecting electrode CE4 are coupled to each other.

The third and fourth strain gauges ST3 and ST4 may have different lengths. Further, the third and fourth strain gauges ST3 and ST4 may have lengths shorter than those of the first and second strain gauges ST1 and ST2. Accordingly, the input sensing panel 200_2 may sense the touch pressure on only some regions in the row rather than on all regions of the row.

The touch pressure may be sensed in a plurality of regions through the third strain gauges ST3 and the fourth strain gauges ST4. For example, each of multi-touch pressures of the user may be sensed by a method of selectively connecting the plurality of strain gauges to each of the first Wheatstone bridge circuit units WS1 using switching elements or the like.

However, the present disclosure is not limited to that shown in FIG. 8, and the number, the lengths, and the positions of the strain gauges may be adjusted according to the region in which the touch pressure of the user is required to be detected. Further, in the drawing, two three electrodes forming a strain gauge are shown as forming a loop structure in units of rows, but the present disclosure is not limited thereto. For example, the two force electrodes may be further spaced apart from each other to form a loop structure in units of a plurality of rows.

Figure 9:
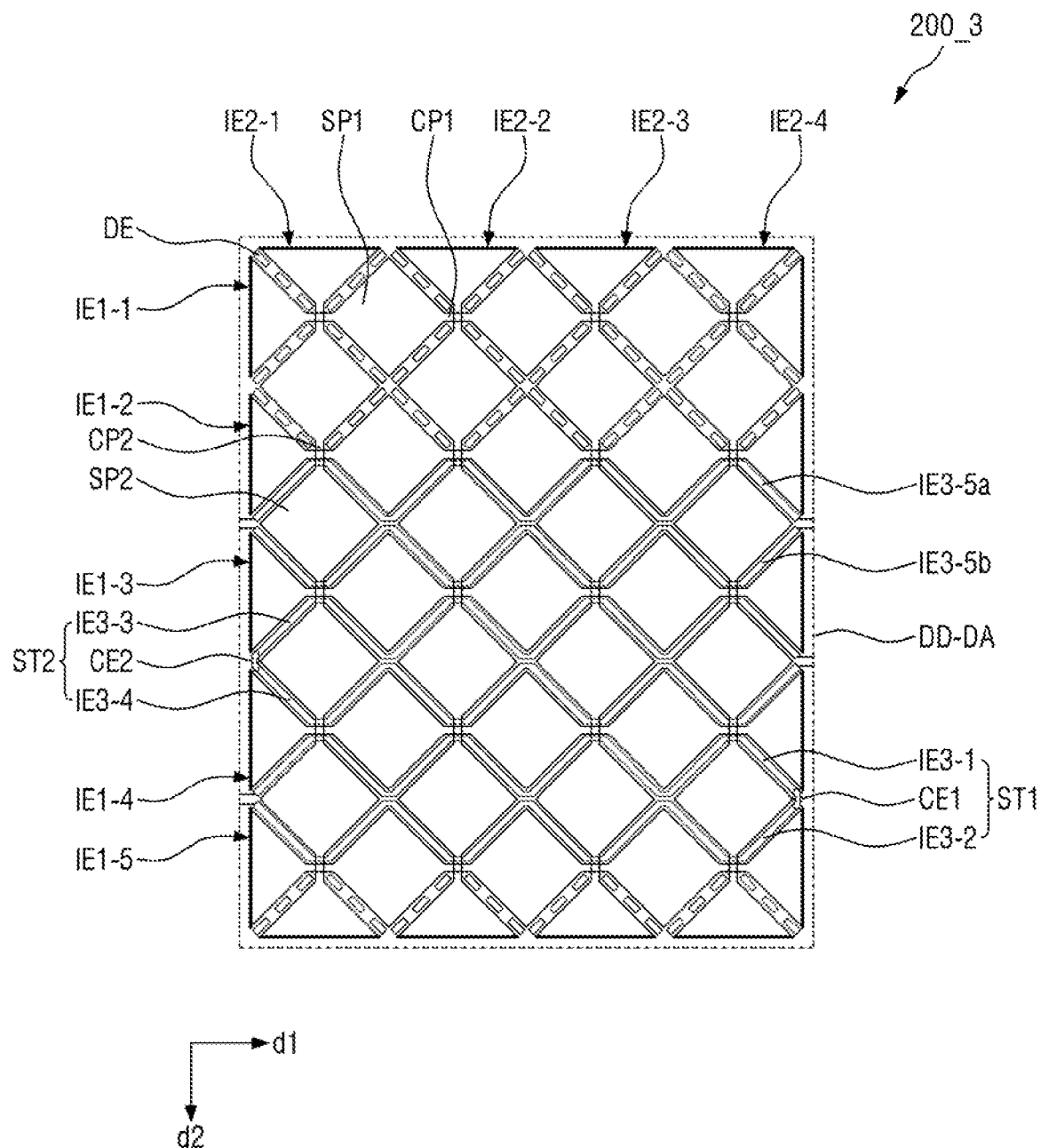
FIG. 9 is a plan view illustrating an input sensing panel of a display device according to an exemplary embodiment of the present disclosure.

FIG. 9 is a plan view showing an input sensing panel of a display device according to an exemplary embodiment of the present disclosure.

Referring to FIG. 9, an input sensing panel 200_3 may further include primary fifth strain gauges IE3-5a and secondary fifth strain gauges IE3-5b. Here, the primary fifth strain gauges IE3-5a and the secondary fifth strain gauges IE3-5b might not have a loop structure and may be connected in parallel. For example, one end of each of the primary fifth strain gauges IE3-5a and one end of each of the secondary fifth strain gauges IE3-5b may be connected to the same signal line. Further, the other end of each of the primary fifth strain gauges IE3-5a and the other end of each of the secondary fifth strain gauges IE3-5b may be connected to the same signal line. The fifth strain gauges IE3-5a and the primary fifth strain gauges IE3-5b may be connected to Wheatstone bridge circuit units to have a parallel structure, and thus the resistance values of the primary fifth strain gauges IE3-5a and the secondary fifth strain gauges IE3-5b may be reduced to half of the resistance values of the first and second strain gauges ST1 and ST2.

Figure 10:
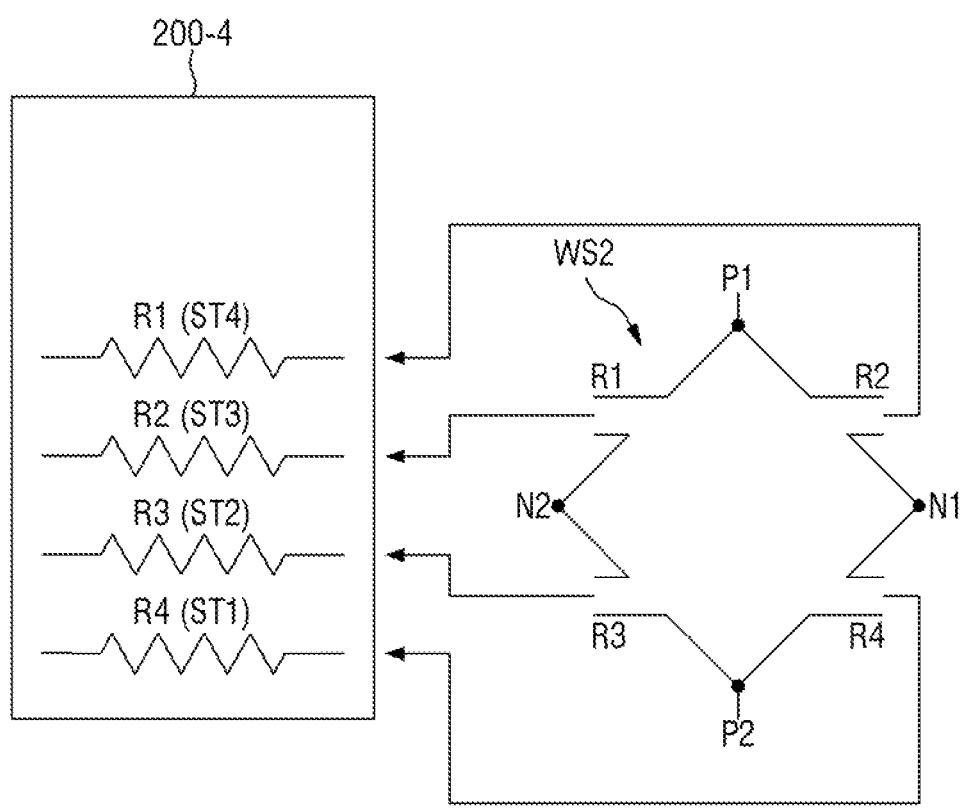
FIG. 10 is a plan view illustrating an input sensing panel of a display device according to an exemplary embodiment of the present disclosure.

FIG. 10 is a plan view illustrating an input sensing panel of a display device according to an exemplary embodiment of the present disclosure.

Referring to FIG. 10, an input sensing panel 200_4 may include first to fourth strain gauges ST1 to ST4 connected to a second Wheatstone bridge circuit unit WS2.

As described above, the touch pressure of the user may be detected using a change in resistance of the first strain gauge ST1 and the fourth strain gauge ST4 corresponding to a fourth resistor R4 and a first resistor R1, respectively. Temperature compensation may be performed using a change in resistance of the third strain gauge ST3 corresponding to a second resistor R2 and the second strain gauge ST2 corresponding to a third resistor R3.

For example, when a temperature of the display device is changed due to a change in an external temperature or an increase of an internal temperature, values of resistors constituting the second Wheatstone bridge circuit unit WS2 may be changed. The second Wheatstone bridge circuit unit WS2 may be configured to add the second and third strain gauges ST2 and ST3 and the second and third strain gauges ST2 and ST3 may be disposed adjacent to the first and fourth strain gauges ST1 and ST4, and thus a change in an external temperature may be compensated for. In an exemplary embodiment of the present disclosure, a value of the touch pressure may be measured by storing a relationship between the change in resistance value between the second and third strain gauges ST2 and ST3 and the change in temperature therebetween in advance and then applying offset values according to the above relationship to an amount of change in resistance between the first and fourth strain gauges ST1 and ST4.

Since a relationship between the resistors constituting the second Wheatstone bridge circuit unit WS2 and the first to fourth strain gauges ST1 to ST4 is given as one example, the values of the resistors constituting the second Wheatstone bridge circuit unit WS2 may vary according to the positions of the first to fourth strain gauges ST1 to ST4 or the like.

Figure 11:
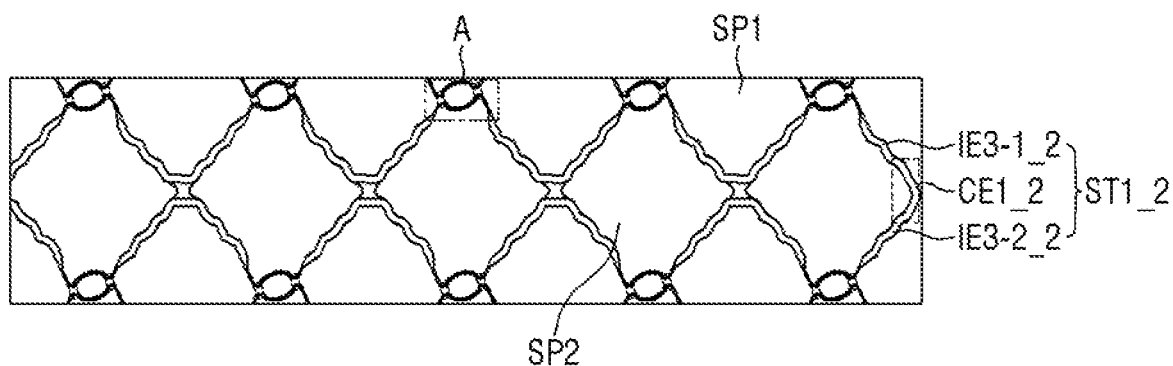
FIG. 11 is a plan view illustrating a portion of the input sensing panel according to an exemplary embodiment of the present disclosure.
Figure 12:
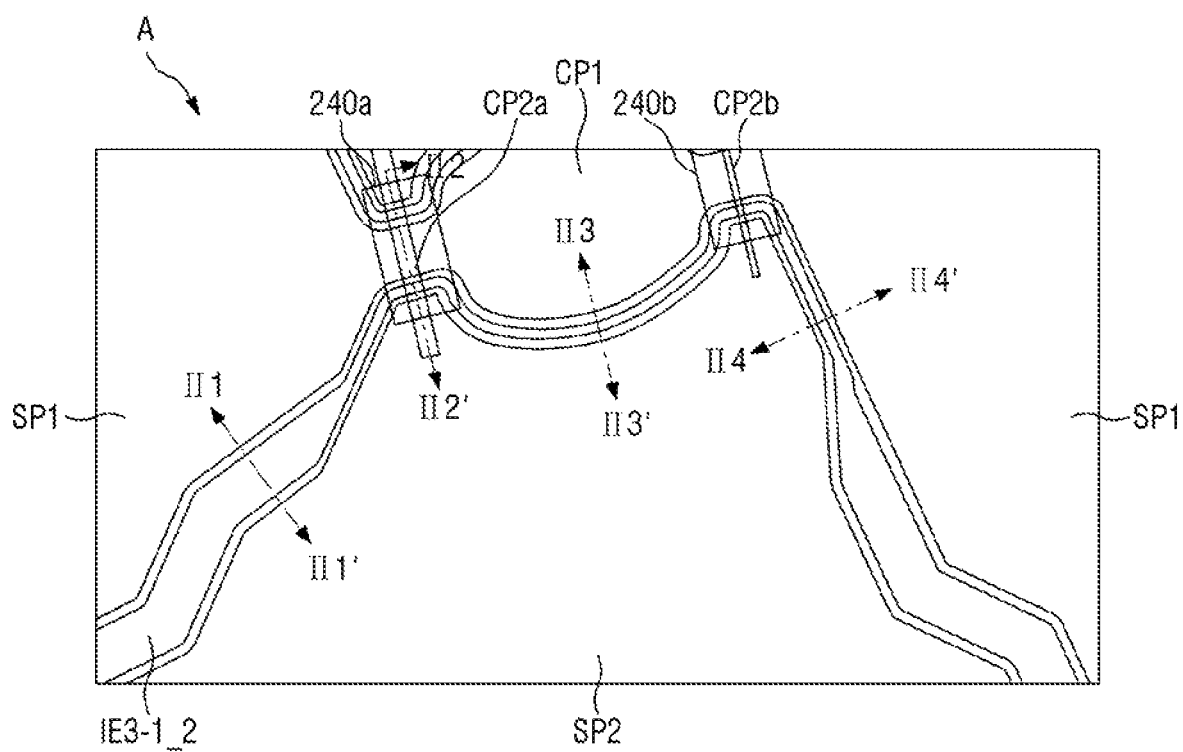
FIG. 12 is an enlarged view of a portion A shown in FIG. 11.
Figure 13:
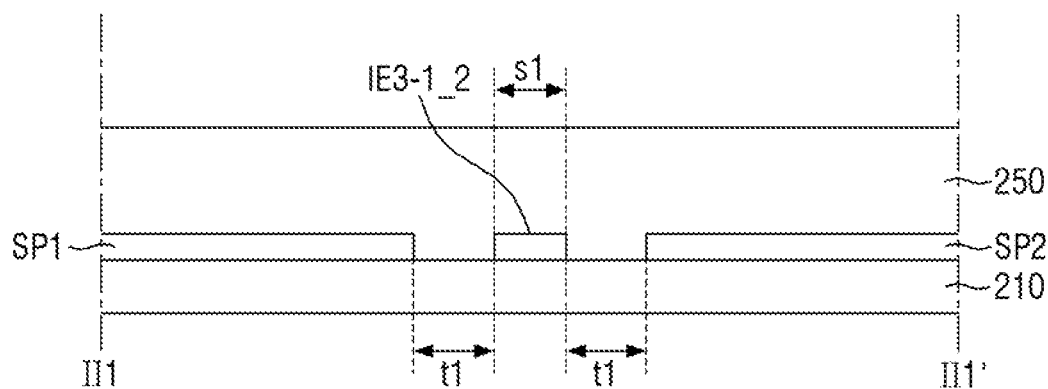
FIG. 13 is a cross-sectional view taken along line II1-II1' shown in FIG. 12.
Figure 14:
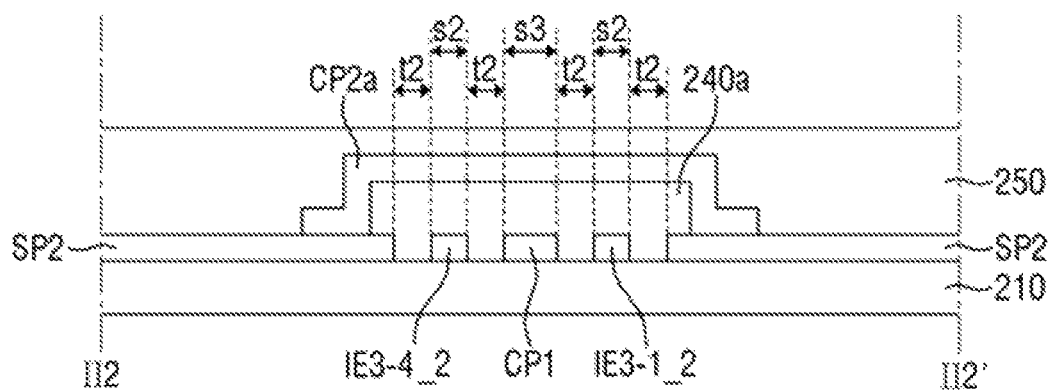
FIG. 14 is a cross-sectional view taken along line II2-II2' shown in FIG. 12.
Figure 15:
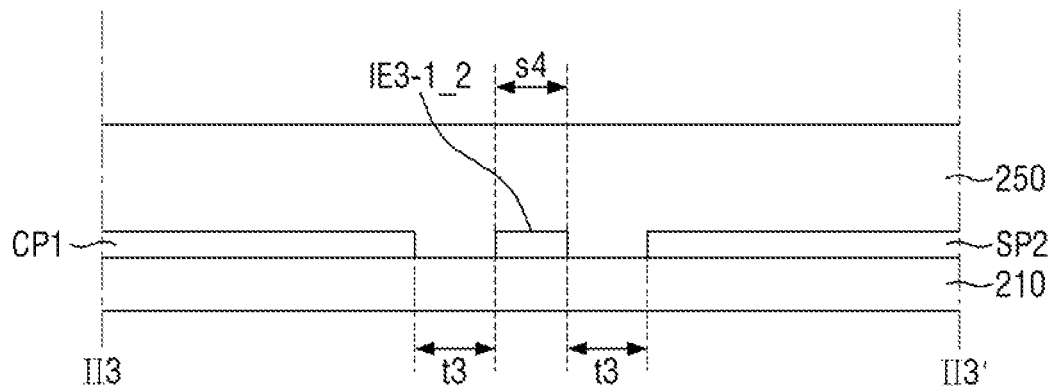
FIG. 15 is a cross-sectional view taken along line II3-II3' shown in FIG. 12.
Figure 16:
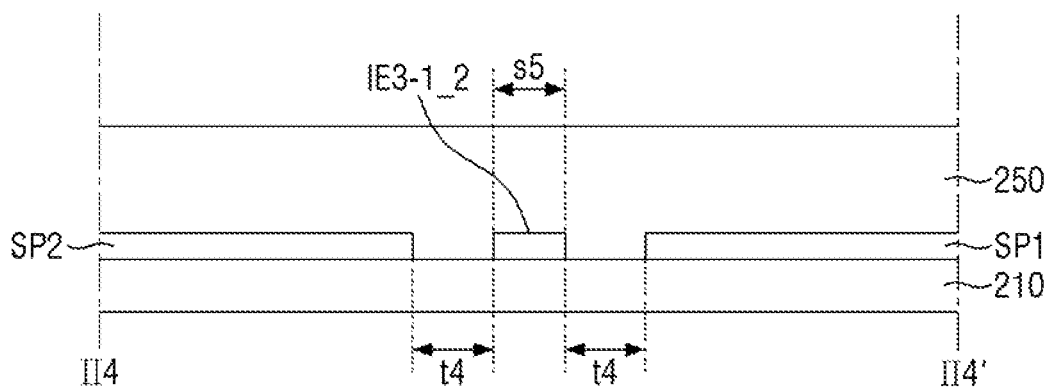
FIG. 16 is a cross-sectional view taken along line II4-II4' shown in FIG. 12.

FIG. 11 is a plan view illustrating a portion of an input sensing panel according to an exemplary embodiment of the present disclosure. FIG. 12 is an enlarged view of a portion A shown in FIG. 11. FIG. 13 is a cross-sectional view taken along line II1-II1' shown in FIG. 12. FIG. 14 is a cross-sectional view taken along line II2-II2' shown in FIG. 12. FIG. 15 is a cross-sectional view taken along line II3-II3' shown in FIG. 12. FIG. 16 is a cross-sectional view taken along line II4-II4' shown in FIG. 12.

Referring to FIGS. 11 to 16, a plurality of first sensor units SP1 and a plurality of second sensor units SP2 may have, a polygonal shape close to a square, diamond, or rhombus shape. Further, the plurality of adjacent second sensor units SP2 may be electrically connected to each other through two second connecting units CP2a and CP2b. The two second connecting units CP2a and CP2b may be disposed on insulating patterns 240a and 240b, respectively.

The two second connecting units CP2a and CP2b and force electrodes constituting a strain gauge may be maintained at a predetermined interval when viewed from above. For example, the predetermined interval may be about 75 µm or more. Therefore, a short circuit between two electrodes (e.g. a connecting unit and a three electrode) caused by misalignment which may occur in a process of forming the insulating patterns 240a and 240b and the two second connecting units CP2a and CP2b may be prevented.

Since the plurality of first sensor units SP1 and the plurality of second sensor units SP2 have a polygonal shape close to a square, diamond, or rhombus shape, widths s1, s2, s4, and s5 of a first force electrode IE3-1_2 of a first strain gauge ST1 extending along an outer periphery of each of the sensor units may also vary according to the position thereof. For example, the widths s1, s2, s4, and s5 of the first force electrode IE3-1_2 may be different from each other. Here, the widths s1, s2, s4, and s5 of the first force electrode IE3-1_2 may satisfy a value of about 30 μm to about 140 μm. Further, in an exemplary embodiment of the present disclosure, a distance t1 between the first force electrode IE3-1_2 and the first sensor unit SP1 and a distance t3 between the first force electrode IE3-1_2 and the second sensor unit SP2 may be the same or may be different from each other. In an exemplary embodiment of the present disclosure, the distances t1 and t3 may range from about 20 μm to about 30 μm.

A width s2 of a fourth force electrode IE3-4_2 of the second strain gauges ST2 and the widths s1, s2, s4, and s5 of the first force electrodes IE3-1_2 may be the same. Accordingly, the width s2 of the fourth force electrode IE3-4_2 of the second strain gauges ST2 may satisfy a value of about 30 μm to about 140 μm. However, the present disclosure is not limited thereto, and the fourth force electrode IE3-4_2 and the first force electrode IE3-1_2 may have different widths. In an exemplary embodiment of the present disclosure, a width s3 of the first connecting unit CP1 may be greater than the widths of the fourth force electrode IE3-4_2 and the first force electrode IE3-1_2. For example, the width s3 of the first connecting units CP1 may be about 130 μm.

Further, in an exemplary embodiment of the present disclosure, a distance t2 between the first force electrode IE3-1_2 and the fourth force electrode IE3-4_2 and a distance t2 between the first force electrode IE3-1_2 and the first connecting units CP1 may be the same or may be different from each other according to the shape of the sensor unit at the corresponding position. In an exemplary embodiment of the present disclosure, the distance t2 may range from about 20 μm to about 30 μm.

According to exemplary embodiments of the present disclosure, both touch position and pressure can be sensed using a single input sensing panel.

Further, since a separate input sensing module is not included, a thickness of an input sensing panel and a thickness of a display device including the input sensing panel can be reduced.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. An input sensing device, comprising:
   a plurality of first sensor units extending in a first direction;
   a plurality of second sensor units extending in a second direction different from the first direction;
   a first connecting unit between adjacent first sensor units among the plurality of first sensor units;
   a second connecting unit between adjacent second sensor units among the plurality of second sensor unit; and
   a first force electrode between a first sensor unit among the plurality of first sensor units and a second sensor unit among the plurality of second sensor units,
   wherein the second connecting unit is electrically connected to each of the adjacent second sensor units through a pair of contact holes that are disposed on opposite sides of the first force electrode.

2. The input sensing device of claim 1, wherein the first connecting unit overlaps the second connecting unit.

3. The input sensing device of claim 1, wherein the first force electrode does not overlap the first connecting unit.

4. An input sensing device, comprising:
   a plurality of first sensor units extending in a first direction;
   a plurality of second sensor units extending in a second direction different from the first direction;
   a first connecting unit between adjacent first sensor units among the plurality of first sensor units;
   a second connecting unit between second sensor units among the plurality of second sensor unit;
   a first force electrode between a first sensor unit among the plurality of first sensor units and a second sensor unit among the plurality of second sensor units; and
   a second force electrode between the first sensor unit and another second sensor unit among the plurality of second sensor units,
   wherein the first force electrode overlaps the second connecting unit.

5. The input sensing device of claim 4, wherein the second force electrode overlaps the second connecting unit.

6. The input sensing device of claim 4, wherein the second force electrode does not overlap the first connecting unit.

7. The input sensing device of claim 4, further comprising a first connecting electrode connected to the first force electrode and the second force electrode.

8. The input sensing device of claim 7, further comprising a base layer on which the plurality of first sensor units, the plurality of second sensor units, the first connecting electrode, the first three electrode, and the second force electrode are disposed.

9. The input sensing device of claim 8, further comprising a first insulating layer on the first connecting electrode, the first force electrode, and the second force electrode.

10. The input sensing device of claim 9, wherein the first insulating layer is disposed on the plurality of first sensor units and the plurality of second sensor units.

11. The input sensing device of claim 9, wherein the second connecting unit is disposed on the first insulating layer.

12. The input sensing device of claim 11, wherein the second connecting unit is in direct contact with the adjacent second sensor units through first contact holes, and
   wherein each of the first contact holes exposes corresponding one of the adjacent second sensor units.

13. The input sensing, device of claim 11, further comprising a second insulating layer on the second connecting unit.

14. The input sensing device of claim 7, wherein the plurality of first sensor units, the plurality of second sensor units, the first force electrode, the second force electrode, and the first connecting electrode are disposed on a same layer.

15. The input sensing device of claim 4, the first connecting unit is between the first force electrode and the second force electrode.

16. The input sensing device of claim 4, wherein the first force electrode extends along one side of the second sensor unit, and the second force electrode extends along one side of the another second sensor unit.

17. The input sensing device of claim 1, further comprising a dummy electrode between another first sensor unit among the plurality of first sensor units and another second sensor unit among the plurality of second sensor units.

18. The input sensing device of claim 17, wherein the dummy electrode does not overlap the plurality of first sensor units, the plurality of second sensor units, the first connecting unit, the second connecting unit, and the first force electrode.

19. A display device, comprising:
a display panel; and
an input sensing panel disposed on the display panel, wherein the input sensing panel includes:
   a plurality of first sensor units extending in a first direction;
   a plurality of second sensor units extending in a second direction different from the first direction;
   a first connecting unit between adjacent first sensor units among the plurality of first sensor units;
   a second connecting unit between adjacent second sensor units among the plurality of second sensor unit; and
   a first force electrode between a first sensor unit among the plurality of first sensor units and a second sensor unit among the plurality of second sensor units,
   wherein the second connecting unit is electrically connected to each of the adjacent second sensor units through a pair of contact holes that are disposed on opposite sides of the first force electrode.

20. The input sensing device of claim 19, wherein the first force electrode does not overlap the first connecting unit.

* * * * *